(12) United States Patent  (10) Patent No.: US 7,190,011 B2
Aizawa et al.  (45) Date of Patent: Mar. 13, 2007

(54) SEMICONDUCTOR DEVICE AND METHOD FOR MANUFACTURING SAME

(75) Inventors: Hirokazu Aizawa, Kanagawa (JP); Hiroyasu Minda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 172 days.

(21) Appl. No.: 11/078,477

(22) Filed: Mar. 14, 2005

(65) Prior Publication Data

US 2005/0233517 A1  Oct. 20, 2005

(30) Foreign Application Priority Data

Mar. 31, 2004  (JP)  ............... 2004-108433

(51) Int. Cl.
  *H01L 29/94*  (2006.01)
  *H01L 29/76*  (2006.01)
(52) U.S. Cl. ...................... 257/288; 257/328
(58) Field of Classification Search ............... None
  See application file for complete search history.

(56) References Cited

U.S. PATENT DOCUMENTS 5,466,971 A * 11/1995 Higuchi ...................... 257/751

6,344,368 B1 * 2/2002 Pan ............................ 438/57

FOREIGN PATENT DOCUMENTS

JP  2000-323582  11/2000

OTHER PUBLICATIONS

G. Cellere et al., "Influence of process parameters on plasma damage during inter-metal dielectric deposition," Microelectronic Engineering, 71, 2004, pp. 133-138.

* cited by examiner

*Primary Examiner*—Michael Trinh
*Assistant Examiner*—Kiesha Rose
(74) *Attorney, Agent, or Firm*—Foley & Lardner LLP

(57) ABSTRACT

There is provided a technique for obtaining improved maximum allowed value for the antenna ratio while inhibiting the damage on the gate insulating film of the MOSFET. A semiconductor device having a configuration that comprises a silicon substrate, a contact interlayer film, a first interconnect interlayer film, a first via interlayer film and a second interconnect interlayer film, all of which are sequentially formed in this order, comprises two protective diodes, which are coupled to a MOSFET via the second interconnect.

11 Claims, 14 Drawing Sheets

$R = S_{ms}/S_g$ $R = S_{mb}/S_g$ $R = S_{vb} \times n / S_g$

SEMICONDUCTOR DEVICE AND METHOD FOR MANUFACTURING SAME

The present application is based on Japanese Patent Application No. 2004-108433, the content of which is incorporated hereinto by reference.

BACKGROUND OF THE INVENTION

1. Field of the Invention

The present invention relates to a semiconductor device having a transistor and a method for manufacturing the same.

2. Related Art

The processing utilizing plasma is often employed in processes for manufacturing semiconductor devices including a metal oxide semiconductor field effect transistor (MOSFET) and a complementary metal oxide semiconductor (CMOS). In such manufacturing process utilizing plasma, electric charge may be accumulated within an interconnect layer that is electrically coupled to a gate electrode of a MOSFET disposed on a silicon substrate. This phenomenon is referred to as an antenna effect. Electrical current potential of the interconnect layer is increased due to the accumulation of electric charge, and an electric charge flows to the silicon substrate from the interconnect layer when the increased electric potential exceeds a breakdown voltage for a gate insulator. The gate insulator is damaged in this occasion. When gate insulator is damaged, a leakage current from the gate electrode to the semiconductor substrate is increased, thereby causing a malfunction and reduced reliability of the transistor.

Known techniques for inhibiting the antenna effect include a technique disclosed in Japanese Patent Laid-Open No. 2000-323,582. The semiconductor device disclosed in Japanese Patent Laid-Open No. 2000-323,582 comprises an interconnect layer electrically coupled to an electric input unit of a gate electrode of MOSFET and a diode having a PN junction between semiconductor regions in a substrate. It is described therein that upon having such configuration, charge-up can be avoided.

Also, G. Cellere et al. propose a technique for inhibiting the plasma damage by devising the process for manufacturing the semiconductor device in "Influence of process parameters on plasma damage during inter-metal dielectric deposition", Microelectronic Engineering, Vol. 71, 2004, pp. 133–138.

SUMMARY OF THE INVENTION

However, the present inventors have examined the applicability of the above-described techniques, and found that the reduction of the antenna effect is difficult to be achieved in these techniques when the area ratio of the gate electrode to the interconnect layer is larger. Here, the area ratio of the gate electrode to the interconnect layer is referred to as "antenna ratio", and the larger antenna ratio, which means larger area ratio thereof, provides larger amount of accumulation of the electric charge. Therefore, in order to inhibit the antenna effect, the antenna ratio should be reduced to a level that is not larger than a suitably predetermined value. On the other hand, when the antenna ratio is small, the scale of the interconnect that is coupled to a gate electrode of one MOSFET is limited, while the breakdown of the gate insulating film is inhibited. Thus, the interconnect design is limited, contrary to the request for the advanced integration.

According to the present invention, there is provided a semiconductor device, comprising: a semiconductor substrate; a MOSFET that is provided on a main face of the semiconductor substrate; a protective diode that is coupled to a gate electrode of the MOSFET through an interconnect; a transistor coupling plug that is in contact with the gate electrode on a bottom surface of the transistor coupling plug; and a protective plug that is in contact with the protective diode on a bottom surface of the protective plug and in connect with the gate electrode; wherein bottom surface area of the protective plug is larger than bottom surface area of the transistor coupling plug.

The configuration of the semiconductor device according to the present invention ensures to lead an electric charge, which is accumulated within the interconnect during a plasma processing, to the semiconductor substrate, by providing a protective diode coupled to a gate electrode of the MOSFET, providing a protective plug coupled to a gate electrode of the MOSFET and by bottom surface area of the protective plug being larger than bottom surface area of the transistor coupling plug. In addition, since the configuration includes a plurality of paths for the electric charge, the configuration provides an inhibition of damage in the gate insulating film of the MOSFET during the process for manufacturing the device.

According to the present invention, there is provided a semiconductor device, comprising: a semiconductor substrate; a MOSFET that is provided on a main face of the semiconductor substrate; and a plurality of protective diodes that are coupled to a gate electrode of the MOSFET through an interconnect.

The configuration of the semiconductor device according to the present invention ensures to lead an electric charge, which is accumulated within the interconnect during a plasma processing, from a plurality of protective diodes to the semiconductor substrate by providing a plurality of protective diodes coupled to the MOSFET. In addition, since the configuration includes a plurality of paths for the electric charge, the configuration provides an inhibition of damage in the gate insulating film of the MOSFET during the process for manufacturing the device.

According to the present invention, there is provided a semiconductor device, comprising: a semiconductor substrate; a MOSFET that is provided on a main face of the semiconductor substrate; a protective diode that is coupled to a gate electrode of the MOSFET through an interconnect and includes a diffusion layer provided on the semiconductor substrate; and a plurality of protective plugs that are in contact with the diffusion layer and are coupled to the interconnect.

The configuration of the semiconductor device according to the present invention is provided with a plurality of protective plugs that are in contact with the diffusion layer of the protective diode. Having such configuration, the electric charge accumulated within the interconnect during the plasma processing is certainly led from a plurality of protective diodes to the semiconductor substrate. Therefore, the configuration provides an inhibition of the damage in the gate insulating film of the MOSFET in the process for manufacturing the device. Thus, the reliability of the semiconductor device can be improved.

According to the present invention, there is provided a semiconductor device, comprising: a semiconductor substrate; a MOSFET that is provided on a main face of the semiconductor substrate; a protective diode that is coupled to a gate electrode of the MOSFET through an interconnect and includes a diffusion layer provided on the semiconductor substrate; a transistor coupling plug that is in contact with the gate electrode on a bottom surface of the transistor coupling plug and is coupled to the interconnect; and a protective plug that is in contact with the diffusion layer on a bottom surface of the protective plug and is coupled to the interconnect, wherein bottom surface area of the protective plug is larger than bottom surface area of the transistor coupling plug.

The configuration that involves bottom surface area of the protective plug, that is, larger contact area between the diffusion layer and the protective plug, which is larger than the bottom surface area (contact area with the gate electrode) of the transistor coupling plug, may provide a preferential transfer of the electric charge accumulated within the interconnect during the plasma processing process toward the protective diodes. Thus, the configuration provides an inhibition of causing the damage in the gate insulating film of the MOSFET in the process for manufacturing the device.

According to the present invention, there is provided a semiconductor device, comprising: a semiconductor substrate; and a MOSFET, which is provided on a main face of the semiconductor substrate and has an antenna ratio of not lower than 10,000, wherein a plurality of protective diodes are coupled to at least one of the MOSFET. In addition, for all of the MOSFETs having the antenna ratio of not lower than 10,000, the MOSFET may have a configuration, in which a plurality of the protective diodes are coupled to the MOSFET.

According to the present invention, there is provided a semiconductor device, comprising: a semiconductor substrate; and a MOSFET, which is provided on a main face of the semiconductor substrate and has an antenna ratio of not lower than 10,000, wherein at least one of the MOSFET includes: a protective diode that is coupled to a gate electrode of the MOSFET through an interconnect and includes a diffusion layer provided on the semiconductor substrate; and a plurality of protective plugs that are in contact with the diffusion layer and are coupled to the interconnect in at least one of the MOSFET. In addition, for all of the MOSFETs having the antenna ratio of not lower than 10,000, a plurality of the protective plug may be provided therein.

According to the present invention, there is provided a semiconductor device, comprising: a semiconductor substrate; and a MOSFET, which is provided on a main face of the semiconductor substrate and has an antenna ratio of not lower than 10,000, wherein at least one of the MOSFET includes: a protective diode that is coupled to a gate electrode of the MOSFET through an interconnect and includes a diffusion layer provided on the semiconductor substrate; a transistor coupling plug that is in contact with the gate electrode on a bottom surface of the transistor coupling plug and is coupled to the interconnect; and a plurality of protective plugs that are in contact with the diffusion layer on a bottom surface of the protective plugs and are coupled to the interconnect, wherein bottom surface area of the protective plug is larger than bottom surface area of the transistor coupling plug. In addition, for all of the MOSFETs having the antenna ratio of not lower than 10,000, a configuration that involves larger bottom surface area of the protective plug than the bottom surface area of the transistor coupling plug may be provided.

Having such configuration, a damage in the gate insulating film can be inhibited even in the case of the MOSFET having the antenna ratio of equal to or higher than 10,000. Therefore, the reliability of the semiconductor device can be improved.

In the semiconductor device according to the present invention, a plurality of the protective diode may be disposed at predetermined intervals. Having such configuration, the electric charge accumulated in the interconnect certainly transfers through the protective diode to the semiconductor substrate in a plurality of paths when the plasma processing is carried out in the process for manufacturing the semiconductor device. In the semiconductor device according to the present invention, the interval may be equal interval. Having such configuration, the electric charge accumulated in the interconnect by the plasma processing can more surely be led to the protective diode.

In the semiconductor device according to the present invention, a plurality of the protective diode may be arranged to form an array pattern. Having such configuration, a breakdown of the gate insulating film can more definitely be inhibited.

In the semiconductor device according to the present invention, the protective diode may be provided within an internal circuit. Having such configuration, the electric charge can more certainly be removed, since the configuration provides reduced paths for transferring the electric charge accumulated in the interconnect. Here, "be provided within an internal circuit" indicates a situation where the protective plug is coupled directly to the interconnect that is provided in an element region surrounded by an I/O region.

In the semiconductor device according to the present invention, the protective diode may be disposed adjacent to the MOSFET via an isolation region. The electric charge accumulated in the interconnect can more certainly be transferred to the protective diode by having the configuration that the protective diode is disposed adjacent to the MOSFET via the isolation region. In addition, the required length of the path for transferring the charge can be reduced.

In the semiconductor device according to the present invention, the interconnect may be coupled to the protective diode via the protective plug, wherein maximum allowed value $R_{max}$ of antenna ratio R of the MOSFET is established in accordance with bottom surface area $S_{CT}$ of the protective plug, and wherein the maximum allowed value $R_{max}$ is presented by Equation (1):

$$R_{max} = 5.0 \times 10^5 (1/\mu m^2) \, S_{CT} + 5000 \tag{1}$$

Having such configuration, a certain level of a flexibility for designing the interconnect can fully be ensured, while more definitely inhibiting the damage in the gate insulating film. Here, in the formula (1), "$(1/\mu m^2)$" indicates a unit of a constant $(5.0 \times 10^5)$.

According to the present invention, there is provided a method for manufacturing the semiconductor device, comprising: forming a MOSFET and a protective diode on a main face of a silicon substrate; embedding a transistor coupling plug and a protective plug within an insulating film, the transistor coupling plug being coupled to a gate electrode of the MOSFET and the protective plug being coupled to a diffusion layer of the protective diode; forming an interconnect within the insulating film, the interconnect being coupled to the transistor coupling plug and the protective plug; and determining an upper limit of antenna ratio of the interconnect coupled to the transistor coupling plug by a contacting area of the protective plug being in contact with the diffusion layer of the protective diode, wherein the interconnect is formed in the forming the interconnect so that the formed interconnect provides the antenna ratio that is equal to or lower than the upper limit determined in the determining the upper limit of the antenna ratio.

The method according to the present invention may additionally include: designing the semiconductor device based on the result obtained by determing; and forming the aforementioned protective diodes and the protective plug, taking into account of the result obtained by designing.

Since the antenna ratio is considered in the design for the protective diode to determine the total contact area of the protective plug with the diffusion layer of the protective plug according to the present invention, the semiconductor device having the configuration, which certainly provides the inhibition of the damage in the gate insulating film of the MOSFET, can be manufactured.

It is to be understood that the invention is capable of use in various other combinations, modifications, and environments, and any other exchanging of the expression between the method and device or the like according to the present invention may be effective as an alternative of an embodiment according to the present invention.

For example, in the semiconductor device, the protective diode may be that disposed in the semiconductor substrate. In this case, the protective diode may be composed of a well having a first conductivity type provided in vicinity of the surface of the semiconductor substrate and an impurity diffusion layer having a second conductivity type provided within the well.

For example, in the method for manufacturing the semiconductor device according to the present invention, the protective diode may be designed so that a plurality of the protective diodes are coupled to at least one of the MOSFETs, in the case that the semiconductor device is the MOSFET having an antenna ratio of equal to or higher than 10,000.

Further, in the method for manufacturing the semiconductor device according to the present invention, the protective diode may be designed so that the protective diode is coupled to at least one of the MOSFETs via the interconnect and a plurality of protective plug, which is coupled to the MOSFET, is provided in the diffusion layer of the protective diode, in the case that the semiconductor device is the MOSFET having an antenna ratio of equal to or higher than 10,000.

In addition, in the method for manufacturing the semiconductor device according to the present invention, the protective diode may be designed so that the protective diode, which includes a conductive plug having a bottom surface area that is larger than a bottom surface area of a transistor coupling plug coupled to the diffusion layer of the MOSFET, is coupled to at least one of the MOSFETs, in the case that the semiconductor device is the MOSFET having an antenna ratio of equal to or higher than 10,000.

Further, in the method for manufacturing the semiconductor device of the present invention, the protective diode may be designed so that maximum allowed value $R_{max}$ of antenna ratio R for the MOSFET satisfies the following formula (1) that is based on the bottom surface area $S_{CT}$ of the protective plug:

$$R_{max} = 5.0 \times 10^5 (1/\mu m^2) \; S_{CT} + 5000 \quad (1)$$

As have been described, according to the present invention, the technique for improving maximum allowed value for the antenna ratio while inhibiting the damage on the gate insulating film of the MOSFET can be achieved by providing a plurality of protective diodes that are coupled to the gate electrode of the MOSFET through the interconnect.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments according to the present invention will be described as follows in reference to the annexed figures. In all figures, identical numeral is assigned to an element commonly appeared in the figures, and the detailed description thereof is not presented in the following descriptions. In addition, in the following embodiments, the side of the main face of the silicon substrate 101 is defined as "top", "front"

or "principal", and the surface of the opposite side of the main face (back surface) is defined as "bottom" or "back".

(First Embodiment)

Figure 1:
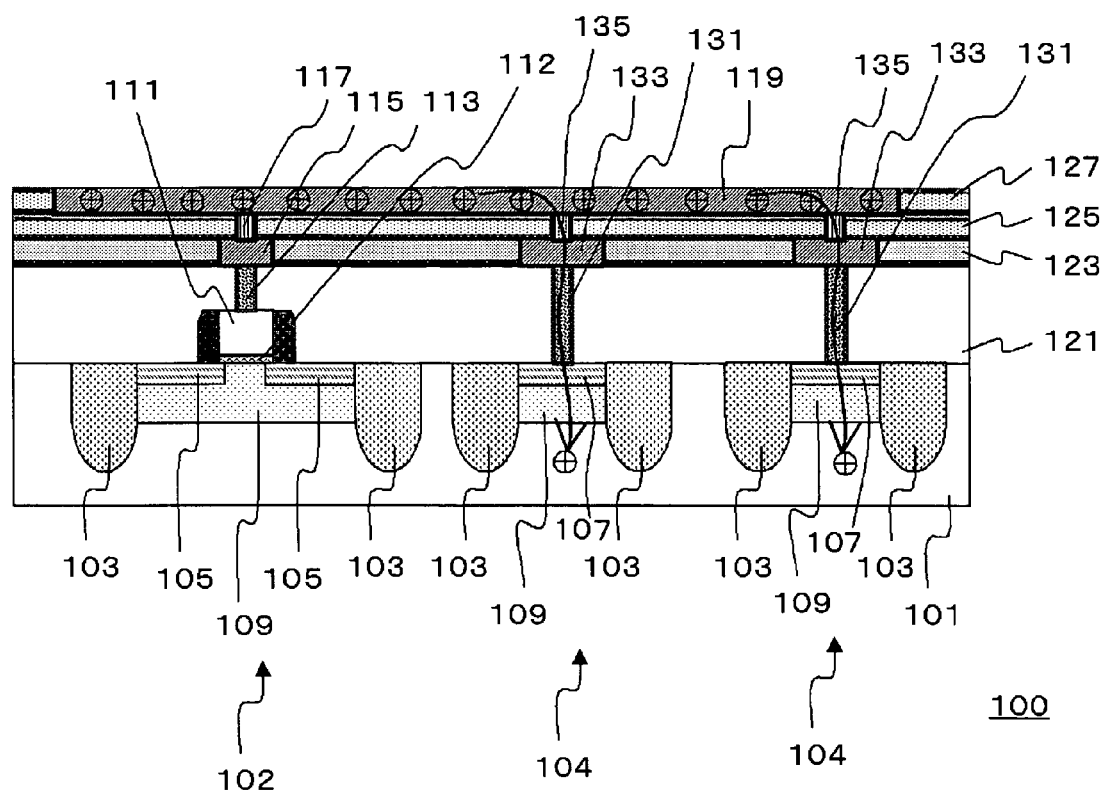
FIG. 1 is a cross-sectional view, schematically illustrating a configuration of the semiconductor device according to present embodiments.

FIG. 1 is a cross-sectional view, schematically illustrating a configuration of a semiconductor device 100 according to the present embodiment. The semiconductor device 100 has a configuration, which comprises a silicon substrate 101, a contact interlayer film 121, a first interconnect interlayer film 123, a first via interlayer film 125 and a second interconnect interlayer film 127, all of which are sequentially formed in this order, and further comprises a MOSFET 102 and two protective diodes 104.

The MOSFET 102 is composed of a diffusion layer 105, a well 109, a gate electrode 111, and a gate insulating film 112. A shallow trench isolation (STI) is provided as an isolation region 103 in a periphery of the diffusion layer 105 and the well 109. The isolation region 103, the diffusion layer 105 and the well 109 are embedded within the silicon substrate 101. The gate electrode 111 and the gate insulating film 112 are also embedded within the contact interlayer film 121. The gate insulating film 112 is composed of an oxide film.

A contact plug 113, which is a conductive plug, is embedded within the contact interlayer film 121, and is provided so as to be coupled to the gate electrode 111. In addition, a first interconnect 115 coupled to the gate electrode 111 is embedded within a first interconnect interlayer film 123, and a conductive first via 117 coupled to the first interconnect 115 is embedded within a first via interlayer film 125. Further, a second interconnect 119 coupled to the first via 117 is embedded within the second interconnect interlayer film 127.

The protective diode 104 has the well 109 and the diffusion layer 107. The well 109 and the diffusion layer 107 are embedded within the silicon substrate 101, and the periphery edge of the well 109 and the diffusion layer 107 is provided with the device isolation region 103. A protective plug 131 embedded within the contact interlayer film 121 is coupled to the diffusion layer 107. In addition, a first interconnect 133 embedded within the first interconnect interlayer film 123 is in contact with the protective plug 131. In addition, a first via 135 embedded in the first via interlayer film 125 is in contact with the first interconnect 133. Further, the first via 135 is in contact with the second interconnect 119 that is coupled to the MOSFET 102.

As described above, the semiconductor device 100 has a configuration, in which the MOSFET 102 is coupled to the two protective diodes 104 via the second interconnect 119. While FIG. 1 shows the semiconductor device 100 having layers up to the second interconnect 119, layers having metals films may further be disposed on the upper portion of the second interconnect 119 to form a semiconductor device of a multilayered interconnect structure.

Next, a method for manufacturing the semiconductor device 100 shown in FIG. 1 will be described. Methods that may ordinarily be employed for manufacturing the semiconductor device having multilayered interconnect structure can be applied to the manufacture of the semiconductor device 100.

Firstly, the MOSFET 102, the protective diode 104 and the isolation region 103 are formed on the silicon substrate 101. Then, an etching stopper (not shown in the drawings) and the contact interlayer film 121 are disposed in this sequence on the entire upper face of the silicon substrate 101.

In this occasion, an etching stopper of, for example, a SiN film is deposited by a plasma CVD technique. In addition, the contact interlayer film 121 of, for example, a $SiO_2$ film is deposited by a plasma CVD technique. Alternatively, a multilayered film may be formed by depositing the contact interlayer film 121 with a L-Ox™ film that is a low dielectric constant interlayer insulating film by an application technique or with a SiOC film by a plasma CVD technique, and then $SiO_2$ film may be deposited on the upper face of the low dielectric constant interlayer insulating film.

Then, the contact interlayer film 121 is dry etched to form openings at positions where the contact plug 113 and the protective plug 131 are to be provided, thereby providing coupling holes. Then, an etching back process is conducted to the etching stopper by a dry etching to form openings for connecting with the gate electrode 111 or the diffusion layer 107, and then a wet processing for removing etching residue is carried out.

Next, a barrier metal film (not shown in the drawings) is deposited by a sputtering technique, and subsequently a tungsten (W) film (not shown in the drawings) is deposited on the barrier metal film by a metal organic chemical vapor deposition (MOCVD) technique to fill the coupling hole with the tungsten film. Then, the barrier metal film on the contact interlayer film 121 and the W film are removed by a chemical mechanical polishing (CMP) to form the contact plug 113 and the protective plug 131.

Then, the first interconnect interlayer film 123 is deposited on the contact interlayer film 121, and the first interconnect 115 and the first interconnect 133 are provided in the first interconnect interlayer film 123. Similarly, the first via 117 and the first via 135 are provided in the first via interlayer film 125. Then, the second interconnect 119, is provided in the second interconnect interlayer film 127. As such, the semiconductor device 100 shown in FIG. 1 is obtained.

Advantageous effects obtainable by the semiconductor device 100 shown in FIG. 1 will be described as follows.

In the semiconductor device 100, two protective diodes 104 are coupled to one MOSFET 102. Having such configuration, sum of the contact area of the protective plug 131 contacting with the diffusion layer 107 (bottom surface area of the protective plug 131) can be suitably increased. Thus, the electric charge accumulated in the second interconnect 119 can be suitably distributed over a plurality of protective diodes 104, so that the charge can release to the silicon substrate 101 without passing through the MOSFET 102, when a plasma processing is employed for the manufacture of the semiconductor device 100. Since the paths for electric current are distributed over the plurality of protective diodes 104, the antenna effect in MOSFET 102 can certainly be inhibited. Therefore, the damage in the gate insulating film 112 and/or the accompanying generation of the leakage current can certainly be inhibited. Therefore, the scale of the interconnects coupled to the MOSFET 102 can be increased.

In addition, in the semiconductor device 100, the interconnects and the coupling plugs from the protective diodes 104 to the second interconnect 119 are configured to be formed simultaneously with forming the interconnect and a coupling plug that couple the MOSFET 102 to the second interconnect 119. Thus, the configuration requires no additional manufacturing process, thereby providing improved production yield and stable manufacturing.

Here, FIG. 1 illustrates the configuration, in which the two protective diodes 104 are coupled to the gate electrode 111 of the MOSFET 102. In addition, the MOSFET 102 is connected to the protective diode 104 on the second interconnect 119. However, number and the coupling process of the protective diodes 104 coupled to the gate electrode 111 of the MOSFET 102 are not limited to the above-described embodiment, and these may be suitably selected in response to the design of the semiconductor device 100.

Figure 2:
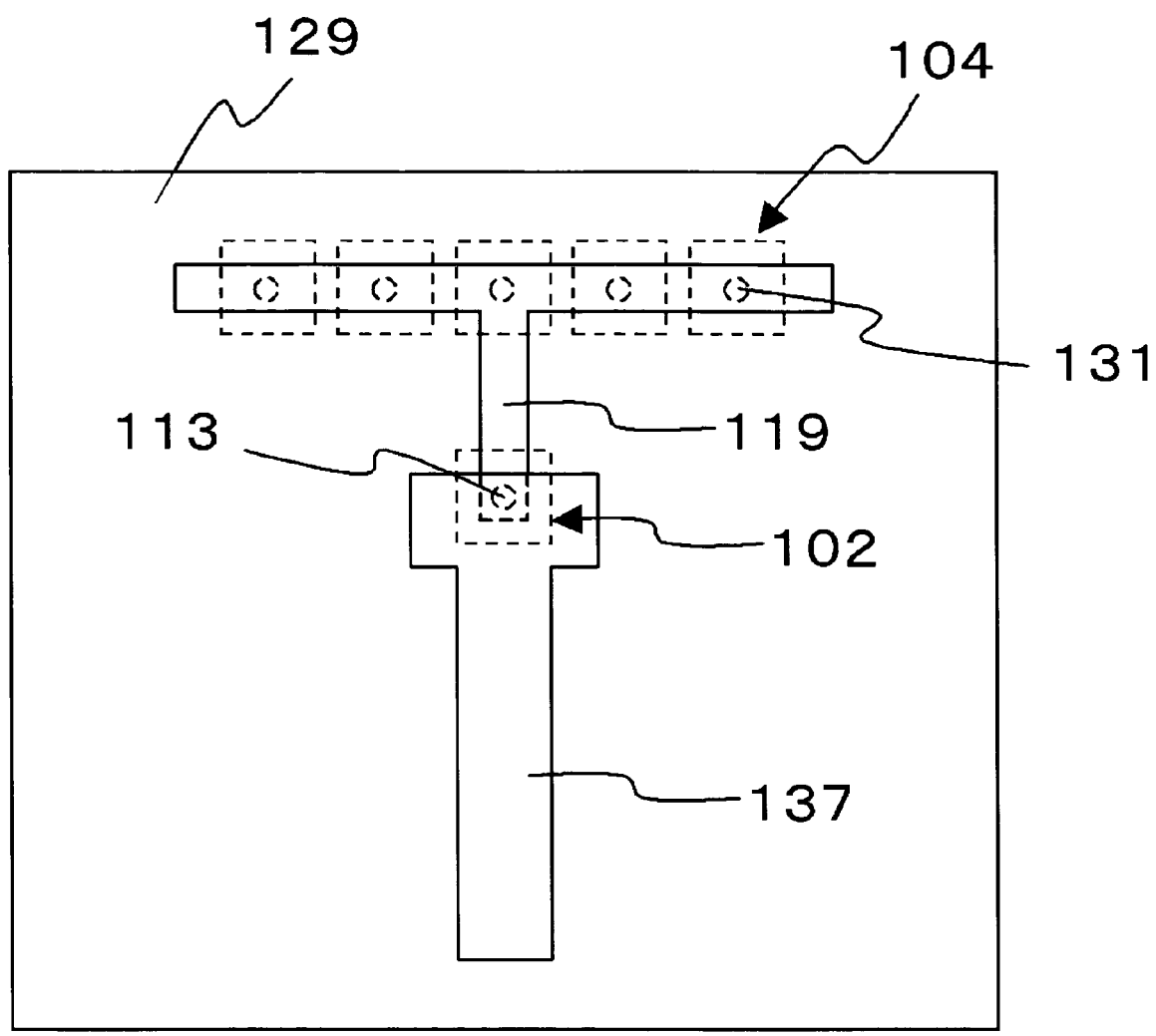
FIG. 2 is a plan view, schematically illustrating the configuration of the semiconductor device according to the present embodiments.
Figure 3:
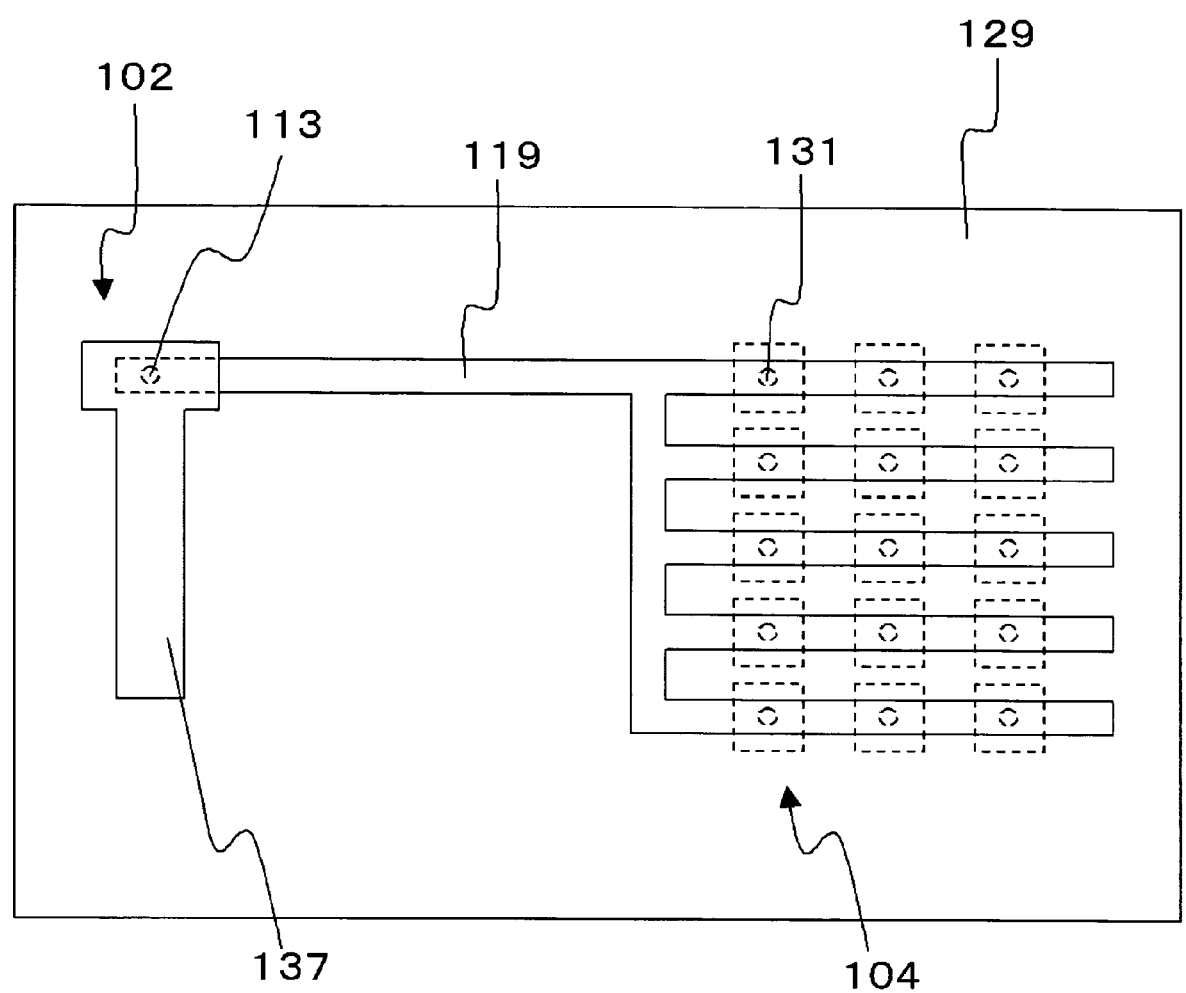
FIG. 3 is a plan view, schematically illustrating the configuration of the semiconductor device according to the present embodiments.

FIG. 2 and FIG. 3 are plan views, illustrating examples of the arrangement of the MOSFET 102 and the protective diodes 104. For example, as shown in FIG. 2, a configuration is presented, in which the gate electrode 111 (not shown in FIG. 2) of the MOSFET 102 are electrically coupled to a plurality of protective diodes 104 arranged to be an array pattern with equal intervals in the internal circuit 129. In addition, as shown in FIG. 3, a two-dimensional arrangement of the plurality of protective diodes 104 coupled to the second interconnect 119 in internal circuit 129 may be employed. As such, number of the protective diodes 104 coupled to one gate electrode 111 may be increased to distribute the paths for transferring the electric charge, thereby more certainly inhibiting the antenna effect.

Here, the configuration illustrated in FIG. 2 and FIG. 3 includes the MOSFET 102 that is coupled to the upper interconnect 137 provided on the upper layer of the second interconnect 119. Further, the internal circuit 129 indicates a portion of the device region surrounded by the I/O region of the device region of the semiconductor device 100.

(Second Embodiment)

Figure 4:
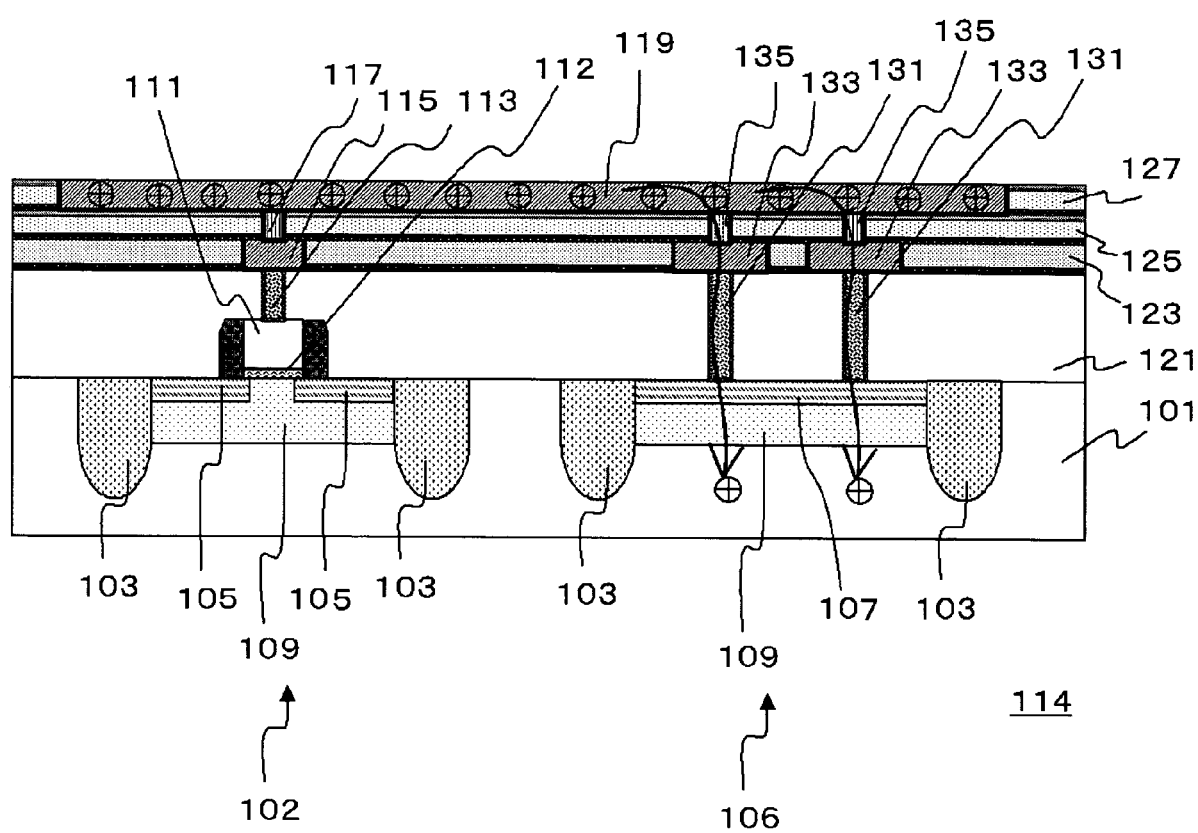
FIG. 4 is a cross-sectional view, schematically illustrating the configuration of the semiconductor device according to the present embodiments.

FIG. 4 is a cross-sectional view, schematically illustrating a configuration of a semiconductor device according to the present embodiment. The semiconductor device 114 shown in FIG. 4 includes a protective diode 106 that is coupled to a second interconnect 119 coupled to a MOSFET 102.

The protective diode 106 includes a plurality of protective plugs 131 that are coupled to a diffusion layer 107. Although FIG. 4 illustrates the configuration having two protective plugs 131 that are coupled to the diffusion layer 107 of the protective diode 106, number of the protective plugs 131 coupled to one diffusion layer 107 is not limited, and may be suitably selected according to the design of the semiconductor device 100.

Sum of the bottom surface areas of the protective plugs 131 being in contact with the diffusion layers 107 can be increased by having a plurality of protective plugs 131 that are coupled to the diffusion layer 107 of one protective diode 106. Thus, the electric charge accumulated in the second interconnect 119 can be dispersed over the plurality of protective plugs 131, so that the charge can surely release to the silicon substrate 101. Therefore, damage in the gate insulating film 112 of the MOSFET 102 can be inhibited. Therefore, the antenna ratio of the interconnect coupled to the MOSFET 102 can be increased. Thus, the scale of the interconnect can be increased.

Further in the semiconductor device 114 of FIG. 4 having an increased number of the protective plugs 131 corresponding to the interconnect scale, the bottom surface area of the protective plug 131 may be selected to be substantially equal to the bottom surface area of the contact plug 113 coupled to the gate electrode 111. By employing such configuration, there may be a configuration that the protective plug 131 can be manufactured in the same process as employed for forming the contact plug 113. Thus, simplification of the manufacturing process can be provided.

A plurality of protective diodes 106 coupled to one MOSFET 102 can be provided in this embodiment, similarly as in the first embodiment. Antenna effect generated in the MOSFET 102 can more certainly be inhibited by coupling the MOSFET 102 to a plurality of protective diodes 106 having the diffusion layers 107, each of which are coupled to a plurality of protective plugs 131.

(Third Embodiment)

Figure 5:
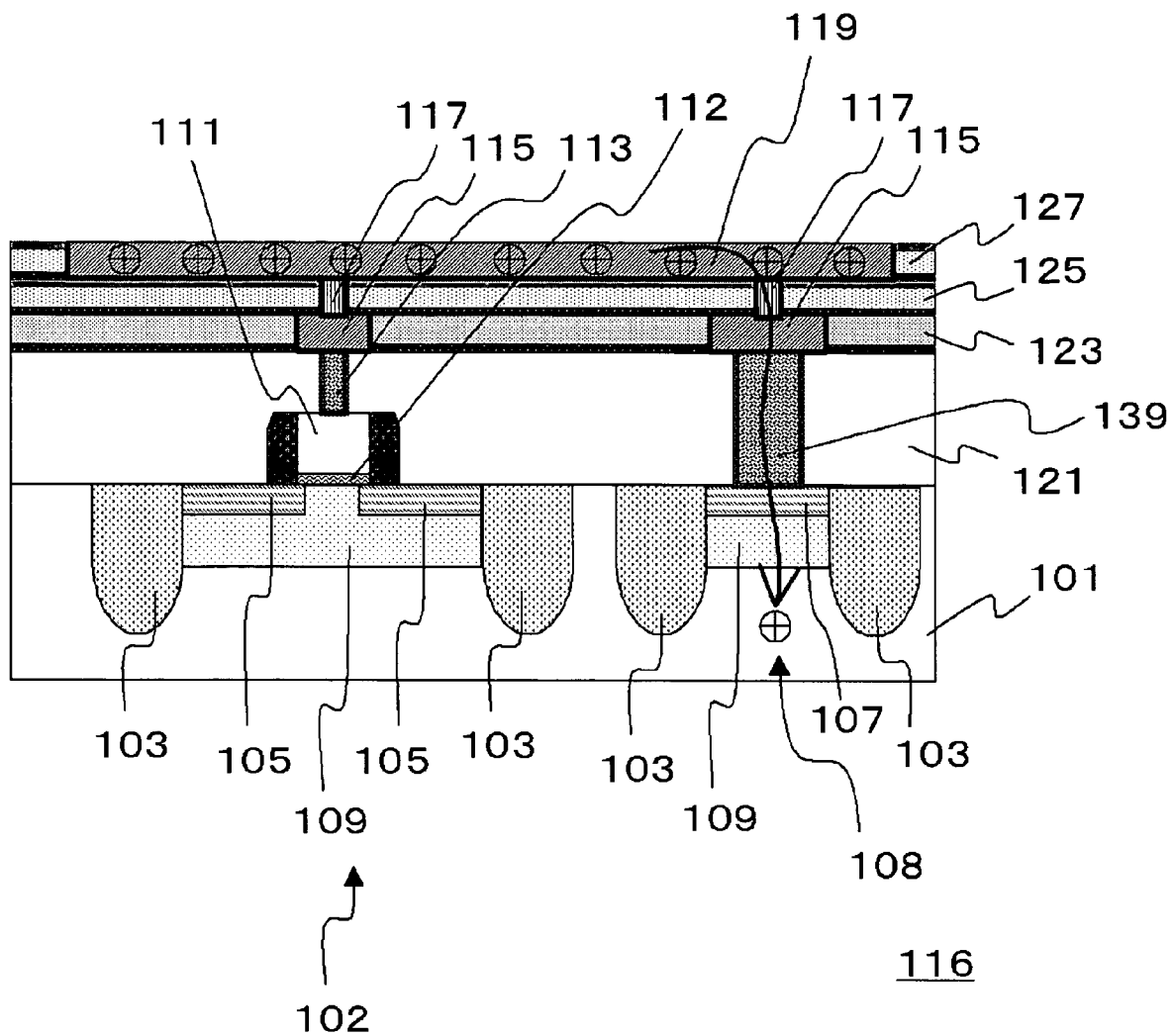
FIG. 5 is a cross-sectional view, schematically illustrating the configuration of the semiconductor device according to the present embodiments.

FIG. 5 is a cross-sectional view, schematically illustrating a configuration of a semiconductor device according to the present embodiment. In the semiconductor device 116 illustrated in FIG. 5, the protective diode 108 is coupled to the second interconnect 119 that is coupled to the MOSFET 102.

The protective diode 108 has a large diameter plug 139 that is coupled to the diffusion layer 107. The large diameter plug 139 is a conductive protective plug having a diameter, which is larger than a diameter of the contact plug 113 that is coupled to the gate electrode 111 of the MOSFET 102. While the diameters of the contact plug 113 and the large diameter plug 139 is changed, the configuration is not necessarily limited to the configuration that involves changing the diameters, provided that the configuration involves changing the bottom surface area (contact area) of the contact plug 113 and the protective plug. Further the bottom surface areas of the contact plug 113 and the large diameter plug 139 indicate the area of the contact surface between the contact plug 113 and the gate electrode 111 and the area of the contact surface between the protective plug 131 and the diffusion layer 107, respectively.

The electric charge accumulated in the second interconnect 119 can be preferentially led toward the side of the large diameter plug 139, so that the charge can definitely release to the silicon substrate 101, by selecting the diameter of the large diameter plug 139 coupled to the diffusion layer 107 of the protective diode 108 to be larger than the diameter of the contact plug 113 coupled to the gate electrode 111. Therefore, damage in the gate insulating film 112 can be inhibited. Thus, the scale of the interconnect coupled to the MOSFET 102 can be increased.

A plurality of protective diodes 108 coupled to one MOSFET 102 can be provided in this embodiment, similarly as in the first embodiment. The antenna effect generated in the MOSFET 102 can more certainly be inhibited by coupling the MOSFET 102 to a plurality of protective diodes 108 coupled to the large diameter plug 139 having larger cross section area than that of the contact plug 113.

Figure 6A:
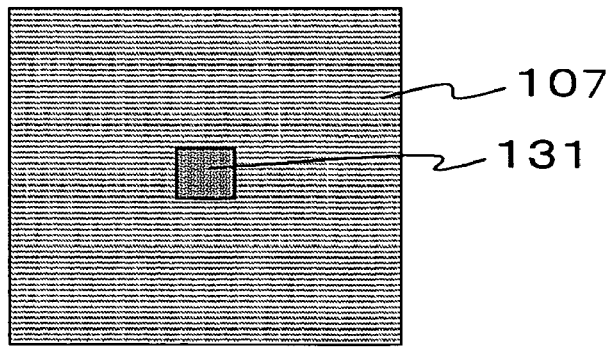
FIGS. 6A, 6B and 6C are plan views, schematically illustrating the configuration of diffusion layer and contact plug of protective diode of a semiconductor device according to the present embodiments.
Figure 6B:
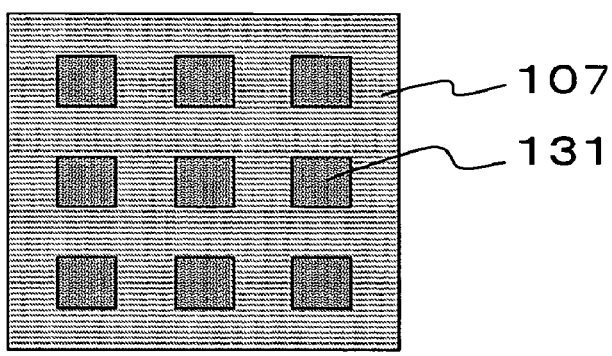
Figure 6C:
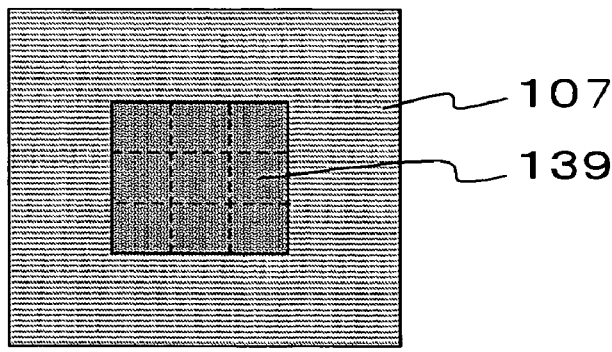

FIG. 6A to FIG. 6C are plan views, schematically illustrating the dimension and location of the diffusion layer 107 of the protective diode and the protective plug coupled to the diffusion layer 107. FIG. 6A corresponds to the case where one protective diode including one protective plug having a diameter same as that of the contact plug 113 is coupled to the second interconnect 119. FIG. 6B corresponds to the configuration described in the second embodiment, and FIG. 6C corresponds to the configuration described in the third embodiment. In cases of FIG. 6B and FIG. 6C, sum of the bottom surface areas of the contact plugs being in contact with the diffusion layer 107 is 9 times of that is the case of FIG. 6A. Thus, the electric charge accumulated in the second interconnect 119 can be certainly led toward the side of the protective diode, so that the charge can surely release to the silicon substrate 101, by having an increased number of the protective plugs 131, similarly as in the case of the protective diode 106 of the second embodiment, or by providing the large diameter plug 139 similarly as in the case of the third embodiment.

Further, in comparison of FIG. 6C and FIG. 6B, number of the paths for transferring the electric charge can be increased by providing a plurality of protective plugs 131 or by having a configuration, in which a plurality of protective diodes 104 are coupled to one gate electrode 111 as in the case of the semiconductor device 100 described in the first embodiment (FIG. 1), as shown in FIG. 6B. Thus, electric charge can be distributed over a plurality of paths to release therefrom, thereby more certainly inhibiting the damage in the gate insulating film 112.

(Fourth Embodiment)

The present embodiment will describe a method for establishing the antenna ratio for one MOSFET 102 in the semiconductor device according to the embodiments. As for the transistor, larger bottom surface area of a gate electrode provides higher breakdown voltage. Therefore, in view of plasma damage, the "antenna ratio" R, which represents a ratio of a bottom surface area of a gate electrode to a scale of a device, is employed for expressing the scale of device. Since the plasma damage is caused in every device, antenna ratio should be calculated for respective devices. Here, the "device" indicates interconnects for respective layers (Metal 1, Metal 2, Metal 3 or the like), vias for respective layers (Via 1, Via 2, Via 3 or the like) and factors for varying the scale of the device includes interconnection length, height or thickness of interconnect, number of via, via diameter or the like. Concerning the interconnects and the vias coupled to the gate electrode of the MOSFET, antenna ratio R can be obtained by, for example, the following manner.

Figure 7A:
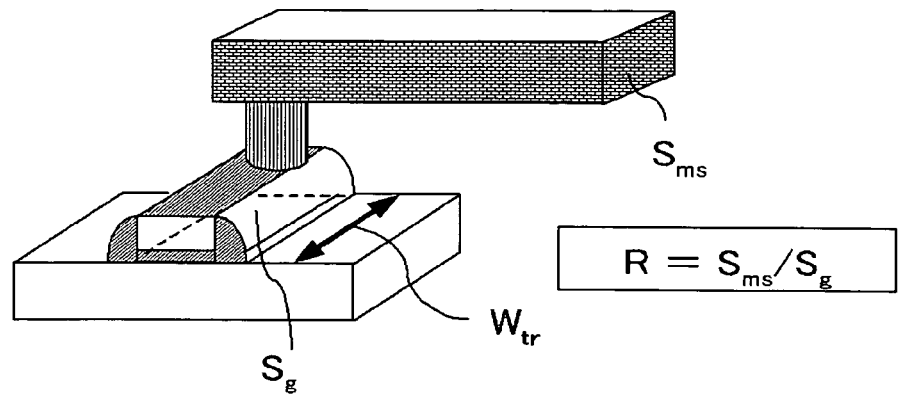
FIGS. 7A, 7B and 7C are schematic diagrams, illustrating the method of calculating antenna ratio for the semiconductor device according to the present embodiments.
Figure 7B:
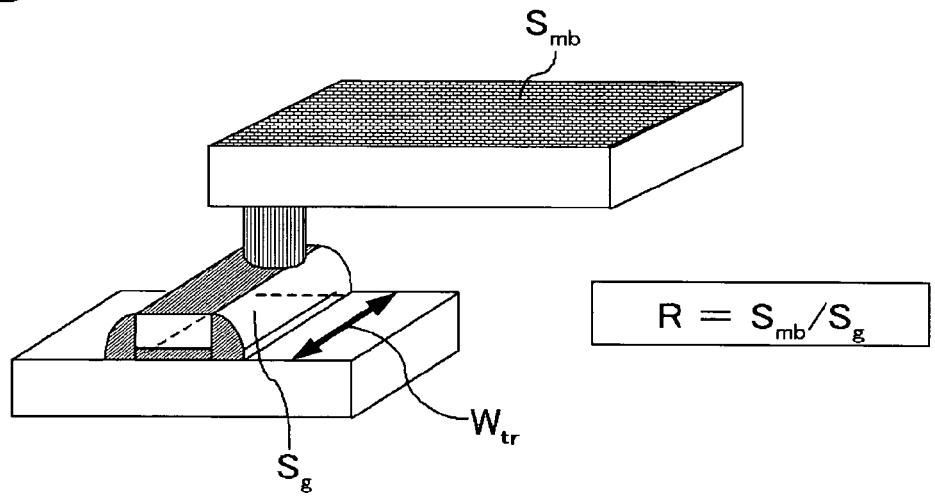
Figure 7C:
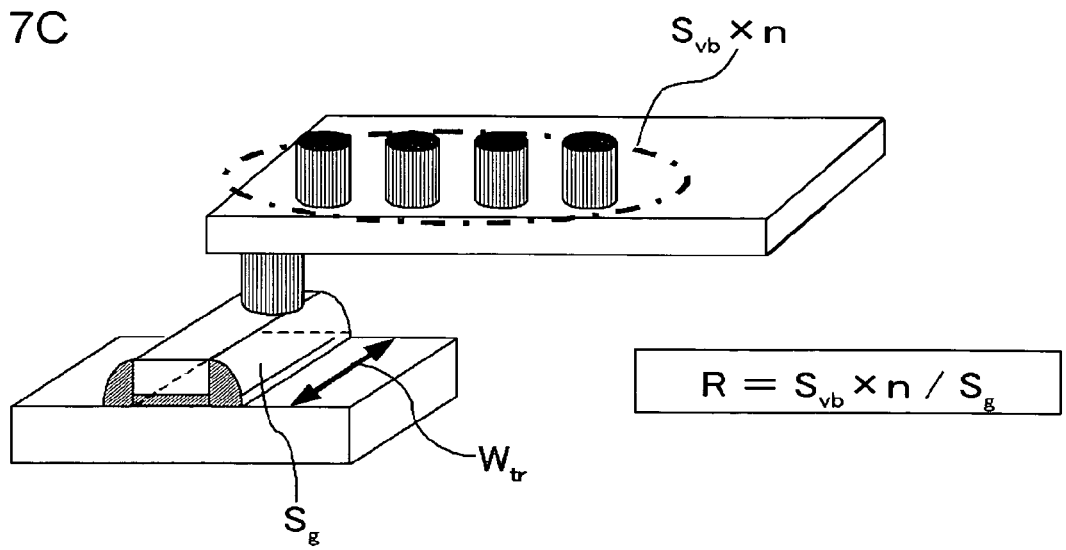

FIG. 7A to FIG. 7C are schematic diagrams, illustrating the method of calculating antenna ratio R for the semiconductor device according to the embodiments. In FIG. 7A to FIG. 7C, $S_g$ indicates a bottom surface area of the gate electrode 111. $S_{ms}$ indicates a side surface area of the interconnect. $S_{mb}$ indicates a bottom surface area of the interconnect. Further, $S_{vb}$ is a bottom surface area of the via, and N is number of the vias coupled to one gate electrode 111, existing in the same layer. Further, $W_{tr}$ is a width of the MOSFET.

As shown in FIG. 7A and FIG. 7B, the antenna ratio of the interconnect can be presented by the following formula (i) or formula (ii):

$$R=S_{ms}/S_g \quad (i)$$

$$R=S_{mb}/S_g \quad (ii)$$

In the present embodiment, an exemplary case of formula (ii), which is used to determine the antenna ratio R with a bottom surface area of an interconnect, will be described as follows.

In addition, antenna ratio of a via can be presented by the following formula (iii), as shown in FIG. 7C:

$$R=S_{vb}\times n/S_g \quad (iii)$$

Figure 8:
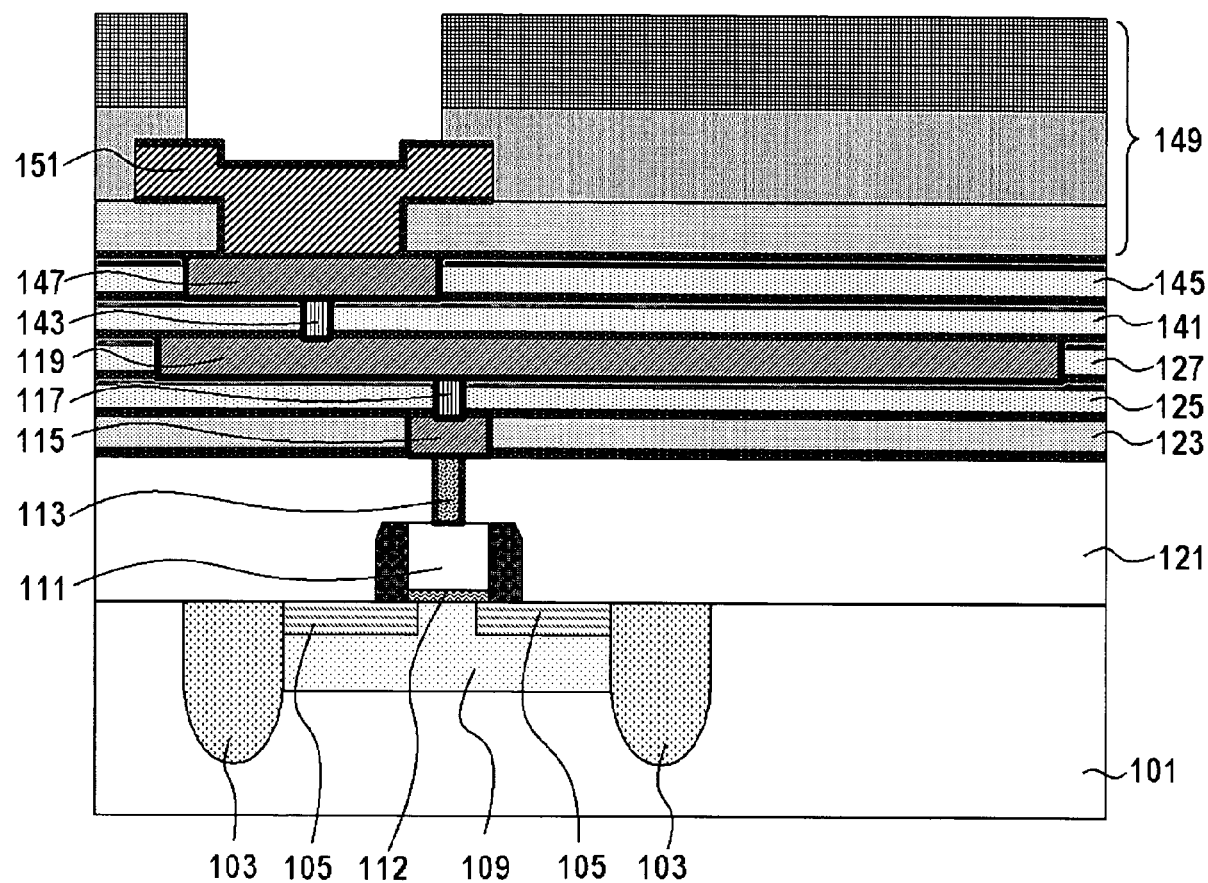
FIG. 8 is a cross-sectional view, schematically illustrating the configuration of the semiconductor device according to the present embodiments.

An antenna effect prevention rules for a semiconductor device can be established by applying formula (ii) and formula (iii) to an interconnect and a via, respectively. FIG. 8 is a cross-sectional view, schematically illustrating a configuration of a semiconductor device. In the above-described semiconductor device, a second via 143 and an interlayer film 141 are formed on the second interconnect 119, a third interconnect 147 and an interlayer film 145 are formed thereon, a pad metal 151 is formed on the third interconnect 147 and a cover film 149 is formed on the interlayer film 145. A method for establishing the antenna effect prevention rules will be described in reference to the configuration of the semiconductor device of FIG. 8. The protective diode is coupled to the Metal 2 under the following reference, though it is not shown in FIG. 8.

In the present embodiment, setting of the antenna effect prevention rules of respective layers coupled to the MOSFET that is coupled to the protective diode are carried out to have the same antenna effect prevention rules, and when the antenna ratio R of the MOSFET is equal to or higher than 10,000, protective diodes coupled to the gate electrode are provided, so that any one of the following conditions is satisfied:

(a) a plurality of protective diodes coupled to the MOSFET are provided;
(b) a configuration, in which one of the protective diodes coupled to the MOSFET has a plurality of protective plug, is provided; or
(c) the protective plug coupled to the diffusion layer of the protective diode has an increased bottom surface area, which is larger than the bottom surface area of the contact plug coupled to the gate electrode of the MOSFET.

Having such configuration, causing a damage in the gate insulating film can be inhibited for the MOSFET having the antenna ratio of equal to or higher than 10,000. Therefore, the increase of the leakage current from the gate electrode to the silicon substrate can be reduced. Thus, the malfunction of the MOSFET can be inhibited.

In the above condition (c), for example, when the contact plug and the protective plug have cylindrical shape, it can be configured that the diameter of the protective plug is larger than the diameter of the contact plug.

Further, when a plurality of MOSFETs having antenna ratio of equal to or higher than 10,000 are provided to one semiconductor device, the semiconductor device may be suitably designed that the majority of these MOSFETs satisfy either one of the above-described conditions (a) to (c). Having such configuration, the probability of causing malfunction in the MOSFET can be further surely reduced. Moreover, it is more preferable to design that all of the MOSFETs having antenna ratio of equal to or higher than 10,000 satisfy either one of the above-described conditions (a) to (c). Having such configuration, malfunction of the MOSFET can more definitely be inhibited.

The quantity of electric charge accumulated in the device can be inhibited by providing such antenna effect prevention rules. This results in limitation of the quantity of electric charge passing through the gate insulating film and the prevention of causing damage. In addition, the antenna effect prevention rules can be increased as compared with the conventional antenna effect prevention rules by providing the protective diode, thereby improving the degree of flexibility in the design of the LSI.

Even in the conventional case of being provided with one protective diode to the MOSFET, it has been designed that antenna ratio is in a range of from 300 to 500, as described in, for example, the G. Cellere et al., "Influence of process parameters on plasma damage during inter-metal dielectric deposition", Microelectronic Engineering, Vol. 71, 2004, pp. 133–138. Onthecontrary, the present embodiment provides the configuration of satisfying either one of the above-described conditions (a) to (c) to achieve sufficiently large antenna ratio of the MOSFET.

(Fifth Embodiment)

Antenna ratio according to one MOSFET 102 can be established as follows, in the semiconductor device according to the above-described embodiments.

In the present embodiment, the configuration is provided, so that the maximum allowed value $R_{max}$ of antenna ratio R of the MOSFET coupled the protective diode is established in accordance with the bottom surface area $S_{CT}$ of the protective plug, and the maximum allowed value $R_{max}$ is presented by formula (1):

$$R_{max}=5.0\times10^5(1/\mu m^2)\ S_{CT}+5000 \quad (1)$$

The device is designed so that the maximum allowed value of antenna ratio for the MOSFET satisfies the above-described formula (1), corresponding to the configuration of the protective diode coupled to the MOSFET, thereby providing further definite inhibition against the plasma damage generated in the manufacturing of the semiconductor device.

Alternatively, the above-described formula (1) can be generalized to express as follows:

$$R_{max} = \alpha \times S_{CT} + A_0 \quad (2)$$

Since $\alpha$ and $A_0$ are constant in the above-described formula (2), $R_{max}$ is a variable, varying in response to the bottom surface area $S_{CT}$ of the protective plug.

$\alpha$ is a coefficient indicating an increase of $R_{max}$ when the protective diode coupled to the MOSFET is changed. Value of $\alpha$ can be experimentally determined by evaluating the change of $R_{max}$ allowed in the case of adding one protective diode thereto. $\alpha$ is expanded to provide $\alpha = \beta/S_0$. $S_0$ is a bottom surface area of the contact plug coupled to the gate electrode of the MOSFET, and can be calculated from a designed value. $\beta$ is a coefficient and indicates the antenna ratio due to an increase of the bottom surface area of the protective plug by $S_0$. Value of $\beta$ can be experimentally determined. Because of nature of $S_0$, $\alpha$ is a variable that is determined depending on the generation of CMOS, and can be empirically obtained as described above. $\alpha$ may be, for example, equal to $5.0 \times 10^5$ ($1/\mu m^2$).

$S_{CT}$ is the bottom surface area of the protective plug, and the bottom surface area can be obtained from the designed value of the semiconductor device.

$A_0$ is a constant, and represents a value equivalent to maximum allowed value of the antenna ratio $R_{max0}$, which is allowed in the case of having no protective diode coupled thereto. $A_0$ can be experimentally obtained by using the MOSFET having no protective diode. $A_0$ may be 5,000, for example.

On the other hand, minimum antenna ratio $R_{min}$ of the case having diode coupled thereto may be, for example, $R_{min} = R_{max}/2$, in the case of $R_{max}/2 > A_0$, and $R_{min} = A_0$ in the case of $R_{max}/2 \leq A_0$.

Having such configuration, damage in the gate insulating film 112 is reduced while providing sufficiently higher antenna ratio.

The embodiments according to the present invention have been described above. However, it is needless to point out that the present invention is not limited to the disclosures in the aforementioned embodiments, and a person having ordinary skills in the art can suitably modify the aforementioned embodiments without departing from the scope of the present invention.

For example, while the use of W for the material of the contact plug 113, protective plug 131 and large diameter plug 139 is illustrated in the above-mentioned embodiment, other materials having higher electric conductivity may also be used. For example, materials such as metals containing aluminum and/or copper as a primary component and the like may be employed.

While the above-described embodiments illustrate the configuration, where the protective plug 131 coupled to the diffusion layer 107 of the protective diode is coupled to the second interconnect 119, the protective plug may be coupled to an upper layer interconnect or a first interconnect 115 disposed above the third interconnect layer.

While the above-described embodiments illustrate the case where the contact plug 113, the protective plug 131 and the large diameter plug 139 has a cylindrical shape, the shape thereof is not limited to the cylindrical shape. For example, the shape of these plugs may be the shape that the area of the upper surface is substantially the same as the area of the bottom surface, such as elliptic cylinder, square rod or the like. Alternatively, the shape thereof may be a frustum of cone, frustum of elliptic cylinder or frustum of pyramid, having no tip on an upper surface. Further, the columnar body may be trench-shape elongating toward one direction.

EXAMPLES

Figure 14:
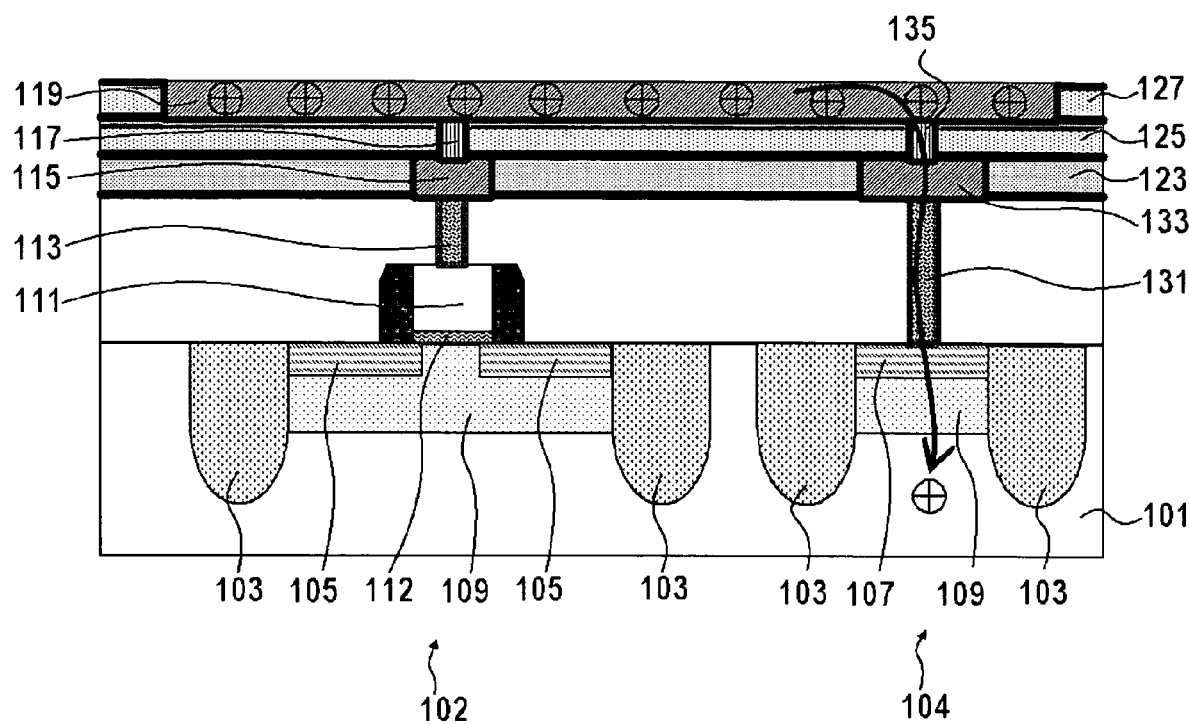
FIG. 14 is a schematic cross-sectional view, illustrating the configuration of the semiconductor device in the examples.

In the following examples, a semiconductor device having a configuration shown in FIG. 14 is employed as a model for estimating the antenna ratio, unless otherwise instructed. FIG. 14 is a schematic diagram, illustrating a configuration of a semiconductor device, in which a protective diode having a protective plug is coupled to one MOSFET.

In the following examples, antenna ratio of a second interconnect (Metal 2), which is calculated via the above-described formula (ii) with a bottom surface area of an interconnect (FIG. 7B), is employed as antenna ratio R, unless otherwise instructed. In calculating the antenna ratio, the bottom surface area of the interconnect may be determined on the basis of, for example, a patterned mask used in the formation of the interconnect.

Example 1

The present example evaluated a relationship of antenna ratio with fraction defective of a MOSFET. First, the semiconductor device illustrated in FIG. 14 was manufactured. Leakage current at the gate electrode was measured by changing the gate insulating film in this semiconductor device, and a chip that exhibits a leakage current exceeding a predetermined threshold current was determined as a defect. The opening diameter of a protective plug was provided to be 0.10 to 0.15 µm.

Figure 9:
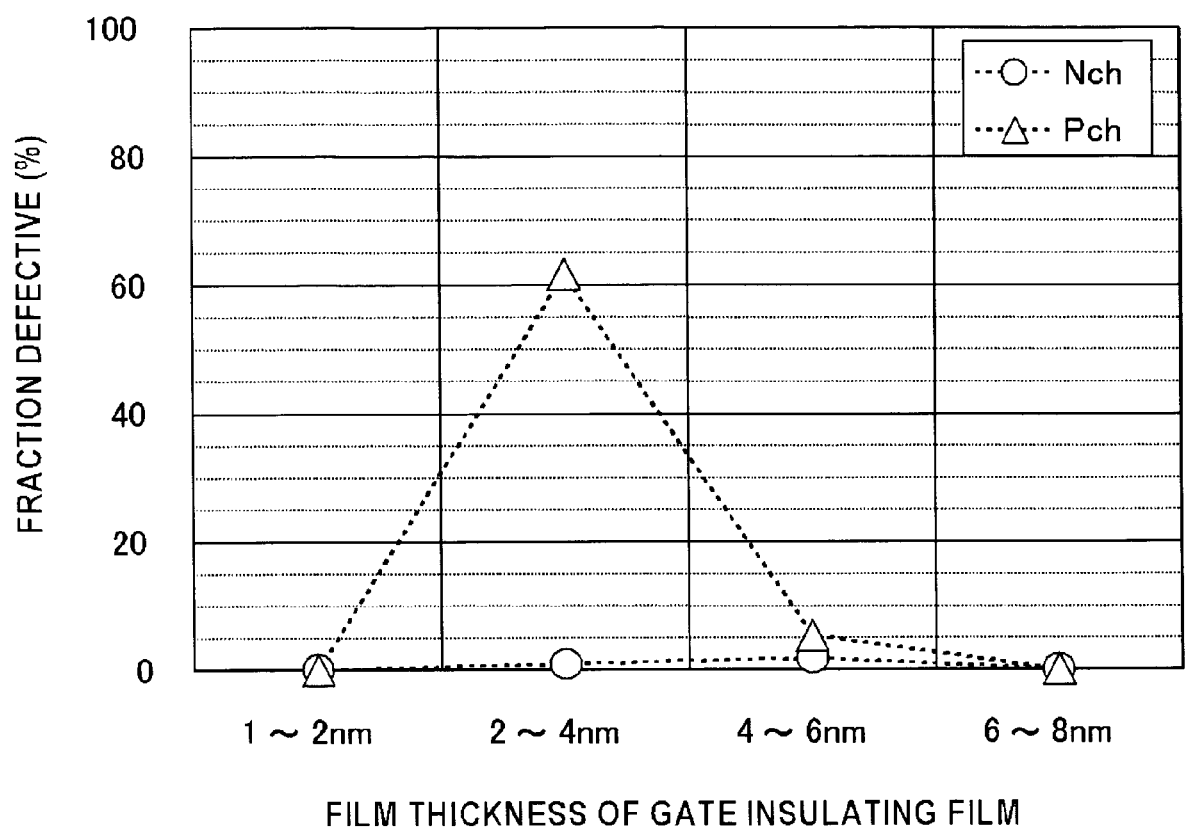
FIG. 9 is a graph showing a relationship between the film thickness and the fraction defective of the gate insulating film of the semiconductor device in examples.

FIG. 9 is a graph showing a relationship between the film thickness and the fraction defective of the gate insulating film. In FIG. 9, the fraction defective obtainable at antenna ratio=50,000, which is helpful for clearly understanding the difference between transistors, was shown. As can be seen from FIG. 9, the lowest plasma damage resistance was obtained when the film thickness of the gate insulating film was 2 to 4 nm.

Consequently, the evaluation of the antenna ratio dependent property on the fraction defective of the transistor was conducted for the transistor comprising a gate insulating film having a thickness of the of 2 to 4 nm, which provides the lowest plasma damage resistance. In this measurement, the semiconductor device (FIG. 14), in which the protective diode having the protective plug is coupled to the MOSFET, was employed. Further, the opening diameter of the protective plug having a circular shape was set to 0.10 to 0.15 µm.

Figure 10:
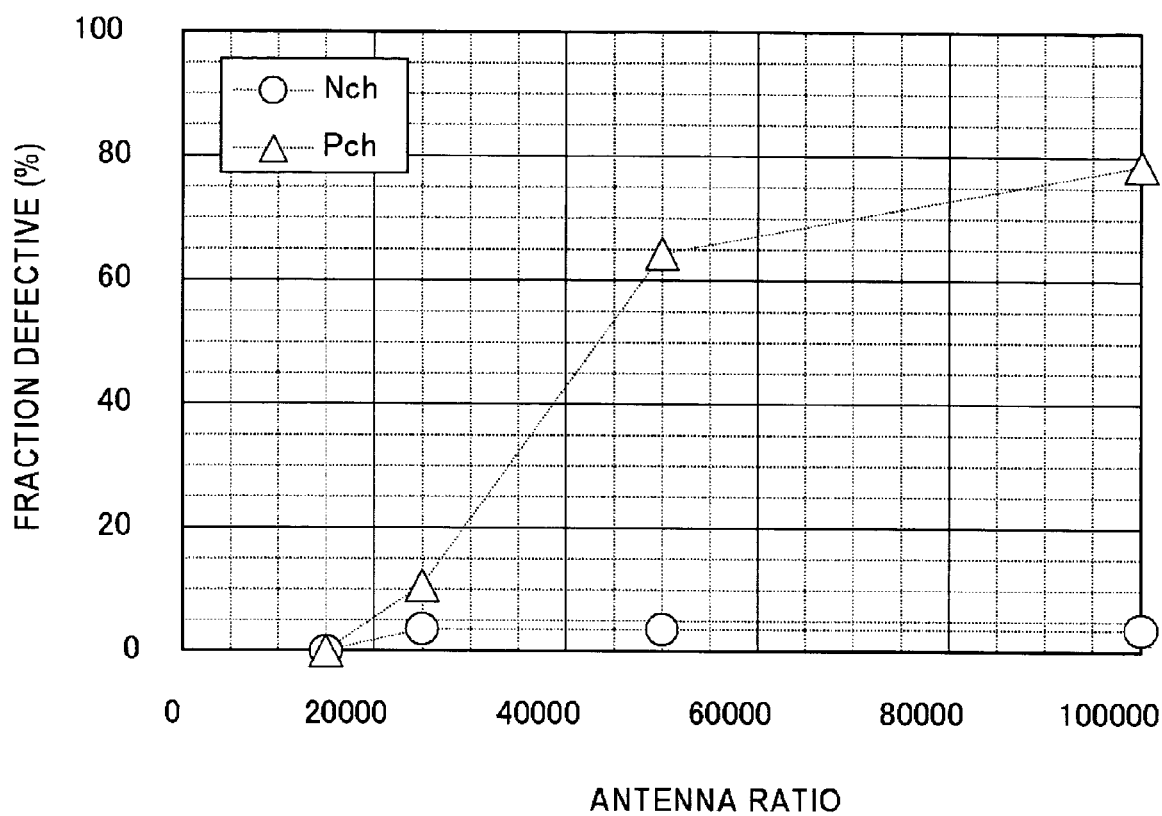
FIG. 10 is a graph showing a relationship between antenna ratio and the fraction defective of the semiconductor device in the examples.

The results are shown in FIG. 10. As can be seen from FIG. 10, the fraction defective increased when the antenna ratio increased to exceed 15,000. Therefore, it is understood that maximum allowed value of the antenna ratio presented by the protective diode having one contact is equal to or less than 15,000. In addition, taking into account of the productivity (safety margin) of the semiconductor device, it is preferable to have an upper limit of the antenna ratio on the order of 10,000.

It is understood from the present example that number of the protective diode should be increased in the semiconductor device having the protective diode coupled to the gate electrode, if the antenna ratio of the gate electrode exceeds 10,000.

Example 2

Figure 11:
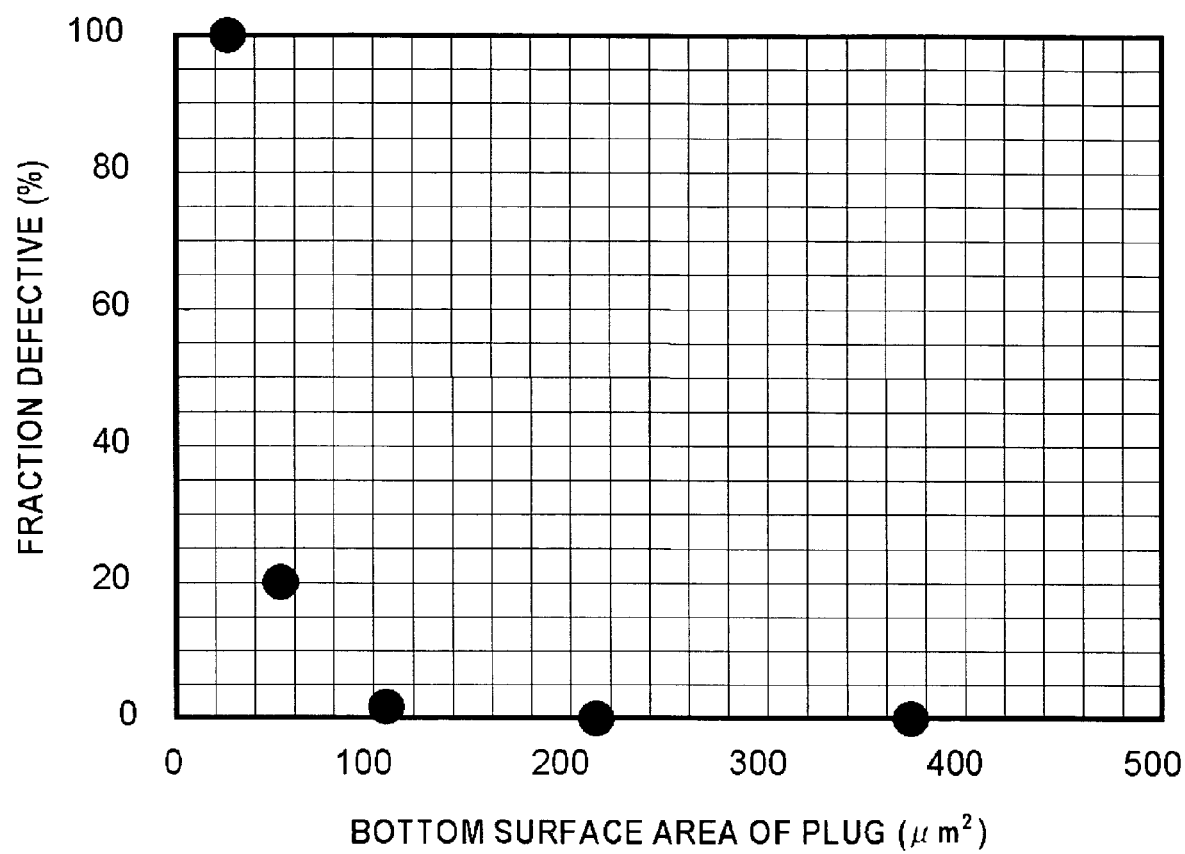
FIG. 11 is a graph showing a relationship of the fraction defective with the bottom surface area of the protective plug of the semiconductor device in the examples.

In this example, a semiconductor device having a plurality of protective diode 104 was manufactured by using the configuration described in the first embodiment (FIG. 1). Total area of the protective plug 131 coupled to the gate electrode 111 was varied by having different number of protective diodes 104 coupled to one gate electrode 111, and a relationship of the fraction defective of the gate electrode 111 therewith was evaluated. FIG. 11 is a graph, showing a relationship of the fraction defective with the bottom surface area of the protective plug 131 coupled to the protective diode 104. As can be seen from FIG. 11, the advantageous effect of reducing the fraction defective can be obtained by increasing number of the protective diodes 104 up to two or more, as compared with the case of having one diode. In addition, it is understood that larger number of the protective diodes 104 coupled thereto provide more easy escaping of the electric charge.

Example 3

In this example, a semiconductor device having a plurality of protective plugs 131 coupled to the diffusion layer 107 of the protective diode 106 was manufactured by using the configuration described in the second embodiment (FIG. 4). More specifically, different antenna ratio was selected by having different number of the cylindrical protective plugs 131 coupled to the diffusion layer 107 of the protective diode 106, as illustrated in the FIG. 12C and in the FIG. 12D. Then, the fraction defective in that condition was evaluated.

Figure 12A:
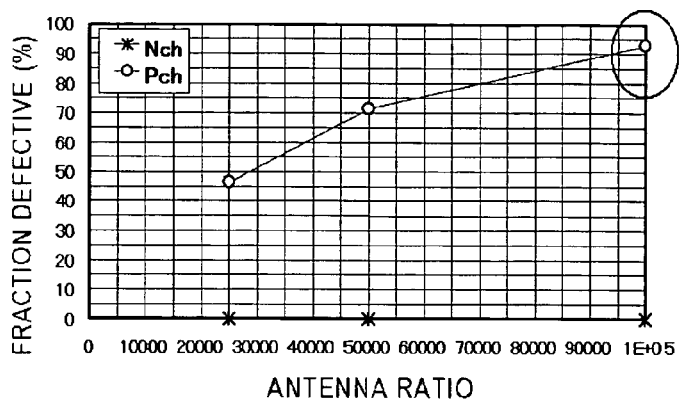
FIGS. 12A and 12B are graphs showing the relationship of antenna ratio with the fraction defective of the semiconductor device in the example and FIGS. 12C and 12D are plan views of the semiconductor device in the examples.
Figure 12C:
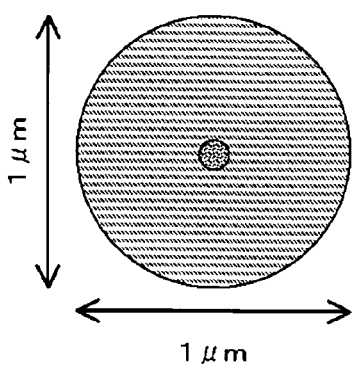
Figure 12B:
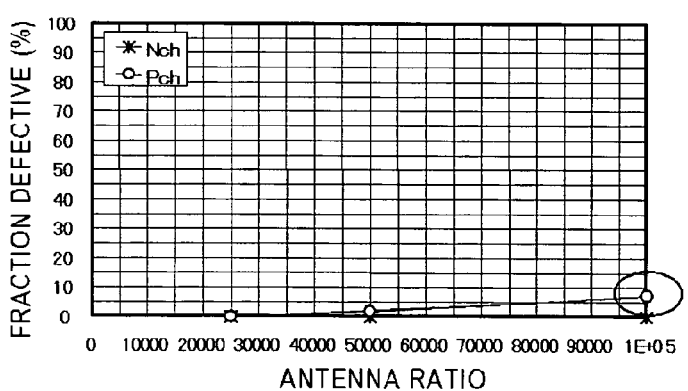
Figure 12D:
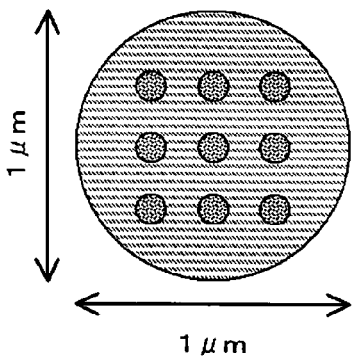

FIGS. 12A and 12B includes graphs showing the relationship of the antenna ratio with the fraction defective of the semiconductor device obtained in the present example. FIG. 12A is a graph showing the relationship of the antenna ratio with the fraction defective of the semiconductor device shown in FIG. 12C. FIG. 12B is a graph showing the relationship of the antenna ratio with the fraction defective of the semiconductor device shown in FIG. 12D. As can be seen from FIGS. 12A and 12B, the advantageous effect of reducing the fraction defective can be obtained by increasing number of the protective plug 131 coupled to the diffusion layer 107 of one protective diode 106 up to two or more. Then, it is understood that larger sum of the contact area of the protective plug 131 with the diffusion layer 107, that is, larger sum of the bottom surface area of the protective plug 131 provides further reduction of the fraction defective.

Further, it was found that, the following relationships of: $\alpha=5.0\times10^5 (1/\mu m^2)$ and $A_0=5,000$ in the above formula (2) for defining $R_{max}$, satisfy providing reduced fraction defective of the device to a level not higher than 5%.

Example 4

Figure 13:
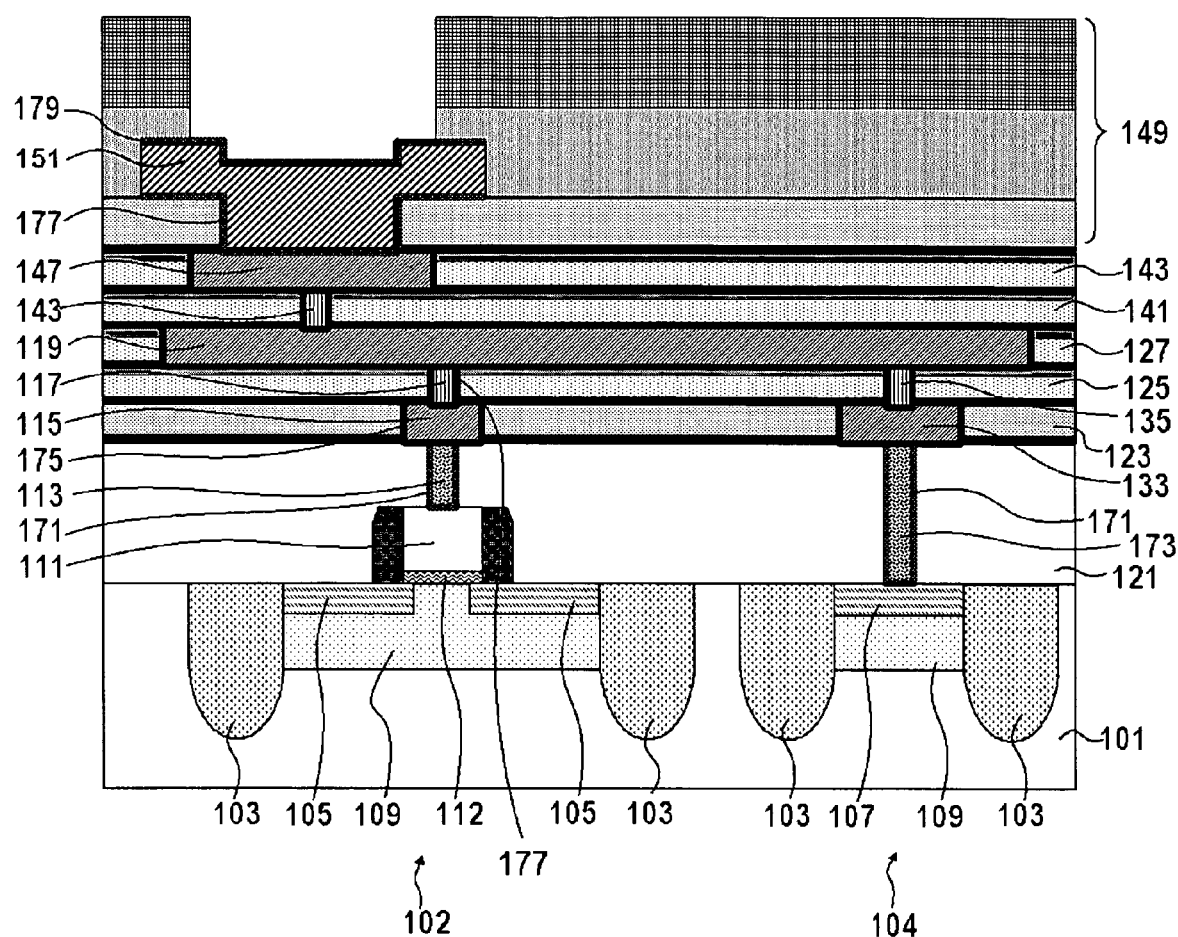
FIG. 13 is a schematic cross-sectional view, illustrating the configuration of the semiconductor device in the examples.

In this example, the semiconductor device that satisfied the above-described formula (1) described in the fifth embodiment was manufactured. FIG. 13 is a schematic cross-sectional view, illustrating a configuration of a semiconductor device according to the present example. As shown in FIG. 13, larger diameter of a contact plug 173 coupled to a protective diode 104 than a diameter of a contact plug 113 coupled to a transistor 102 was employed. A configuration of each layer and each element in the semiconductor device shown in FIG. 13 were designed as follows.

(Gate Insulating Film 112)
Film thickness: 0.1 to 10 nm.

(Contact Plug 113 Coupled to Transistor 102)
Barrier metal 171 was deposited after forming the opening and tungsten was further deposited thereon.
Opening diameter: 100 to 200 nm;
Barrier metal 171 material: a multi-layered film of titanium and titanium nitride;
Titanium film thickness: 5 to 15 nm;
Titanium nitride film thickness: 10 to 20 nm;
Interlayer film 121: silicon oxide film; and
Film thickness: 500 to 800 nm.

(First Interconnect 115 and First Interconnect 133)
Barrier metal 175 was deposited after forming trench and a metal containing copper as a main component was further deposited thereon.
Barrier metal 175 material: a multi-layered film of tantalum and tantalum nitride;
Tantalum film thickness: 50 to 200 nm;
Tantalum nitride film thickness: 50 to 200 nm;
Line width: 100 to 20,000 nm;
Interconnect thickness: 100 to 300 nm;
Interlayer film 123: silicon oxide film was deposited on the silicon nitride film; Film thickness of silicon nitride film: 20 to 100 nm; and
Film thickness of a silicon oxide film: 100 to 400 nm.

(Second Interconnect 119 and Third Interconnect 147)
Barrier metal was deposited after forming trench and a metal containing copper as a main component was further deposited thereon. Barrier metal material: a multi-layered film of tantalum and tantalum nitride;
Tantalum film thickness: 5 to 20 nm;
Tantalum nitride film thickness: 5 to 20 nm;
Line width: 100 to 20,000 nm;
Interconnect thickness: 100 to 300 nm;
Interlayer film 123 and Interlayer film 143: low dielectric constant film was deposited on the silicon nitride film, and then silicon oxide film was deposited thereon;
Film thickness of silicon nitride film: 20 to 100 nm;
Film thickness of low dielectric constant film: 100 to 300 nm; and
Film thickness of a silicon oxide film: 10 to 40 nm.

(Via 117 and Via 143)
Barrier metal 175 was deposited after forming trench and a metal containing copper as a main component was further deposited thereon.
Opening diameter: 100 to 200 nm;
Barrier metal 175 material: a multi-layered film of tantalum and tantalum nitride;
Tantalum film thickness: 5 to 20 nm;
Tantalum nitride film thickness: 5 to 20 nm;
Interlayer film 125 and Interlayer film 141: low dielectric constant film was deposited on the silicon nitride film, and then silicon oxide film was deposited thereon;
Film thickness of silicon nitride film: 20 to 100 nm;
Film thickness of low dielectric constant film: 100 to 300 nm; and
Film thickness of a silicon oxide film: 10 to 40 nm.

(Pad Metal 151)
Lower barrier metal 177 was deposited, and then metal containing aluminum as a main component was deposited, and further upper barrier metal 179 was deposited thereon.
Film thickness of metal containing aluminum as amain component: 1,000 to 3,000 nm;

Lower barrier metal 177 material: a multi-layered film of titanium and titanium nitride;
Titanium film thickness: 30 to 100 nm;
Titanium nitride film thickness: 50 to 300 nm;
Upper barrier metal 179 material: single-layered film of titanium nitride; and
Titanium nitride film thickness: 10 to 50 nm.

(Cover Film 149)

Silicon oxynitride film was deposited on silicon oxide film, and polyimide was deposited thereon to form passivation film (anti-moisture film). Respectively,
Silicon oxide film thickness: 500 to 2,000 nm;
Silicon oxynitride film thickness: 500 to 2,000 nm; and
Polyimide film thickness: 1,000 to 5,000 nm.

In addition, a combination of a transistor 102 and a diode 104 presents, in the case of P-type transistor:
Transistor 102: P$^+$ diffusion layer 105, N well 109;
Diode 104: P$^+$ diffusion layer 107, N well 109;
or in the case of N-type transistor;
Transistor 102: N$^+$ diffusion layer 105, P well 109; and
Diode 104: N$^+$ diffusion layer 107, P well 109.

The obtained semiconductor device has lower fraction defective of the gate electrode 111 of the MOSFET and better operating characteristics of the MOSFET. It is clarified that the damage in the gate insulating film 112 can be inhibited while sufficiently improving antenna ratio, by determining the contact area between the protective plug 173 and the diffusion layer 107 so as to satisfy the above-described formula (1).

It is apparent that the present invention is not limited to the above embodiment, that may be modified and changed without departing from the scope and spirit of the invention.

What is claimed is:

1. A semiconductor device, comprising:
   a semiconductor substrate;
   a MOSFET that is provided on a main face of said semiconductor substrate;
   a protective diode that is coupled to a gate electrode of said MOSFET through an interconnect;
   a transistor coupling plug that is in contact with said gate electrode on a bottom surface of said transistor coupling plug; and
   a protective plug that is in contact with said protective diode on a bottom surface of said protective plug and in connect with said gate electrode;
   wherein bottom surface area of said protective plug is larger than bottom surface area of said transistor coupling plug.

2. The semiconductor device according to claim 1, wherein at least one of said protective diode having a plurality of protective diodes.

3. The semiconductor device according to claim 1, wherein at least one of said protective diode contacting a plurality of protective plugs.

4. The semiconductor device according to claim 1, wherein said protective diode that is coupled to said gate electrode includes a diffusion layer provided on said semiconductor substrate; said protective plug that is in contact with said diffusion layer on a bottom surface of said protective plug, and wherein bottom surface area of said protective plug is larger than bottom surface area of said transistor coupling plug.

5. The semiconductor device according to claim 1, said MOSFET which is provided on a main face of said semiconductor substrate and has an antenna ratio of not lower than 10,000.

6. The semiconductor device according to claim 1, wherein a plurality of said protective diode is disposed at predetermined intervals.

7. The semiconductor device according to claim 1, wherein a plurality of said protective diode is arranged to form an array pattern.

8. The semiconductor device according to claim 1, wherein said protective diode is provided within an internal circuit.

9. The semiconductor device according to claim 1, wherein said protective diode is disposed adjacent to said MOSFET via an isolation region.

10. The semiconductor device according to claim 1, wherein said interconnect is coupled to said protective diode via the protective plug,
    wherein maximum allowed value $R_{max}$ of antenna ratio R of said MOSFET is established in accordance with bottom surface area $S_{CT}$ of said protective plug, and
    wherein said maximum allowed value $R_{max}$, is presented by Equation (1):

$$R_{max}=5.0\times10^5(1/\mu m^2)\, S_{CT}+5000 \qquad (1)$$

11. A method for manufacturing the semiconductor device, comprising:
    forming a MOSFET and a protective diode on a main face of a silicon substrate;
    embedding a transistor coupling plug and a protective plug within an insulating film, said transistor coupling plug being coupled to a gate electrode of said MOSFET and said protective plug being coupled to a diffusion layer of said protective diode;
    forming an interconnect within said insulating film, said interconnect being coupled to said transistor coupling plug and said protective plug; and
    determining an upper limit of antenna ratio of said interconnect coupled to said transistor coupling plug by a contacting area of said protective plug being in contact with said diffusion layer of said protective diode,
    wherein said interconnect is formed in said forming said interconnect so that the formed interconnect provides said antenna ratio that is equal to or lower than said upper limit determined in said determining said upper limit of said antenna ratio.

* * * * *